United States Patent [19]

Youmans et al.

[11] 4,447,780

[45] May 8, 1984

[54] LINEARIZING CIRCUIT AND METHOD OF CALIBRATING SAME

[75] Inventors: Barry J. Youmans, Rittman; Sharon L. Zimmerlin, Chagrin Falls, both of Ohio

[73] Assignee: The Babcock & Wilcox Company, New Orleans, La.

[21] Appl. No.: 315,783

[22] Filed: Oct. 28, 1981

[51] Int. Cl.$^3$ .................... G01R 15/10; B01D 59/40

[52] U.S. Cl. .................................. 324/132; 73/23; 204/1 T; 324/74

[58] Field of Search ................ 324/74, 115, 132, 130; 204/1 Y, 424, 431; 73/1 G, 23; 364/573

[56] References Cited

U.S. PATENT DOCUMENTS 3,895,221 7/1975 Ohata et al. .................... 364/573
4,032,856 6/1977 Goldner ............................ 73/23
4,135,381 1/1979 Sherwin ............................ 73/23
4,145,661 3/1979 Wong ............................... 324/132

OTHER PUBLICATIONS

"Linearising the Output Voltage from Ion-Specific Electrodes," in *Med. & Biol. Eng. & Computing*, vol. 15, No. 6, p. 718, Nov. 1977 by P. Gay.

*Primary Examiner*—Stewart J. Levy
*Attorney, Agent, or Firm*—Vytas R. Matas; Robert J. Edwards

[57] ABSTRACT

A linearizing circuit (10) is disclosed for devices having logarithmic outputs, such as electrolytic oxygen detectors (12). The circuit (10) has an inverting biasing circuit (14) and a scaling circuit (16) connected to an antilog function generator (18) and is calibrated by zeroing the inverting biasing circuit (14) at an extreme point of the desired range and sealing a second point on the desired range in the scaling circuit (16).

10 Claims, 3 Drawing Figures

LINEARIZING CIRCUIT AND METHOD OF CALIBRATING SAME

TECHNICAL FIELD

The present invention generally relates to electronic linearizing circuits and their calibration and, in particular, to a linearizing circuit for linearizing a logarithmic output signal using two point calibration.

BACKGROUND ART

Electrolytic cells such as Zirconium oxide are known to produce a logarithmic output signal indicative of changes in oxygen concentration differential on opposite sides of the electrolytic material. Such electrolytic cells are commonly used in process controls to detect, monitor, and control oxygen concentrations. Their use in control instrumentation requires that they provide a linear output signal requiring the linearization of the normally-produced logarithmic output signal.

In the past, attempts to linearize the logarithmic output signal of the electrolytic cell involved calibration utilizing three points; one at each end of the oxygen concentration range of the electrolytic cell, and a third point in the middle of this range. This generated a best fit straight line which tended to be S-shaped through these three points. The circuitry used to accomplish this linearization usually required three resistance adjustments for the three calibration points. The three resistance adjustments were usually interacting and the calibration required three different test gases for the three calibration points. Thus, the known linearization circuits involved calibration through interpolation rather than extrapolation.

Also, when an atmospheric reference system is used on one side of the electrolytic cell, such as Zirconiumoxide, the logarithmic output of the electrolytic cell reverses polarity at 20.9% oxygen. This fact requires complicated electronics since electronics cannot be easily made to follow such a polarity shift. All these problems resulted in complicated electronics which required calibration with three test gases and produced a relatively inaccurate linearization.

Thus, it can be seen that what was needed was a simple linearizing circuit for the logarithmic output of an electrolytic oxygen detector which would follow the polarity change of atmosphere-referenced electrolytic cells and which could be easily calibated, using less than three test gases.

SUMMARY OF THE INVENTION

The present invention solves the problems associated with prior art devices as well as others by providing a linearizing circuit for an oxygen detector having a logarithmic output range.

To accomplish this, the present linearization circuit biases the polarity change on any logarithmic output having such a polarity change to provide a single polarity logarithmic output. This biased output is then scaled by a scaling circuit connected to the biasing circuit which multiplies the bias signal to a usable value. The output of the scaling circuit is then connected to an antilog generating device which linearizes the biased and scaled signal.

The calibration of this circuit is accomplished by using atmospheric gas as one reference point and another gas on the range desired as the second reference point. This second reference point is usually 100% oxygen. Thus, the biasing circuit is first calibrated to provide a zero output upon subjecting it to the high end point of the range desired such as 100% oxygen. The second reference gas, such as atmospheric oxygen, is used to set the range of the measuring circuit by adjusting the scaling circuit until the desired known output is provided with the circuit being subjected to the atmospheric reference.

In view of the foregoing, it will be seen that one aspect of the present invention is to provide linearizing circuit for devices having a logarithmic output.

Another aspect of the present invention is to provide a linearizing circuit for oxygen detectors having a logarithmic output which has two reference gas calibrations.

Yet another aspect of the present invention is to provide a linearizing circuit for an oxygen detector which is calibrated having independent zero and range calibration.

These and other aspects of the present invention will be more fully understood upon a review of the following description of the preferred embodiment when considered with the accompanying drawings.

DESCRIPTION OF THE PREFERRED EMBODIMENT

Figure 1:
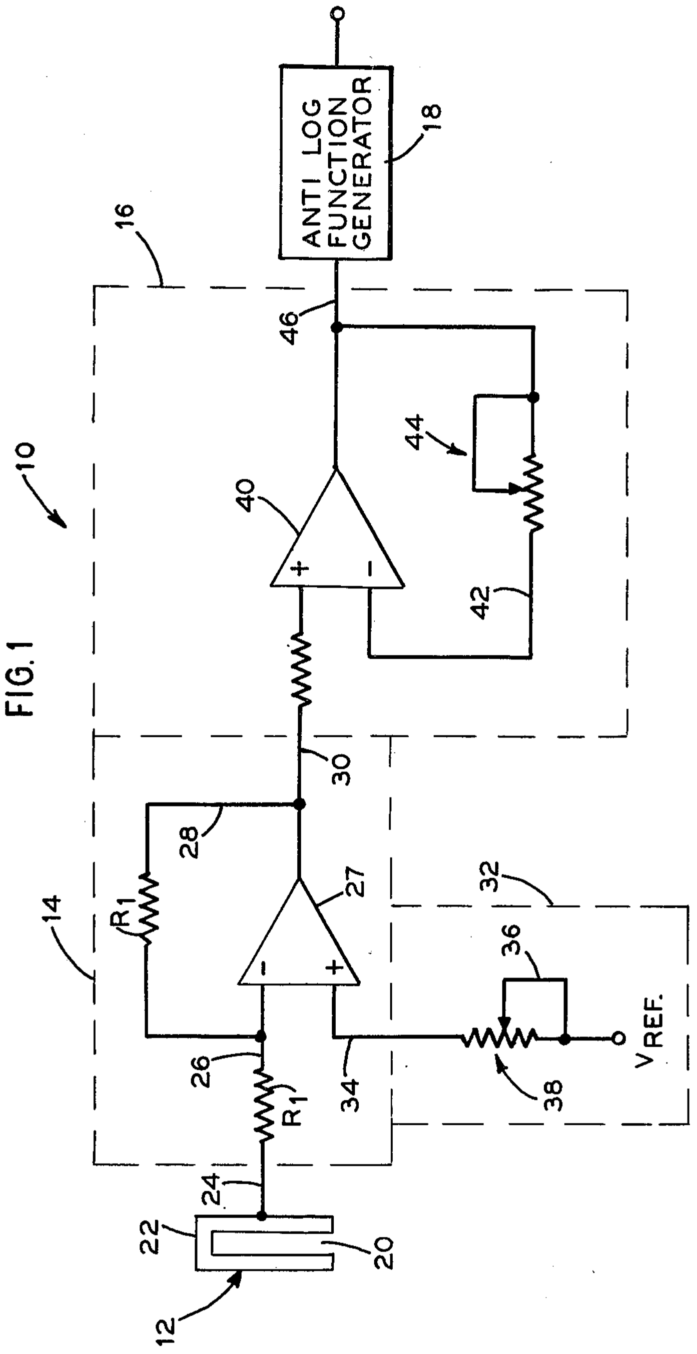
FIG. 1 is a schematic of the linearizing circuit of the present invention.

Referring now to the drawings wherein the showings are intended to disclose a preferred embodiment of the present invention and are not intended to limit the invention thereto, FIG. 1 shows a linearizing circuit 10 for linearizing the logarithmic output signal of an electrolytic cell oxygen detector 12 by progressively sending the signal through a biasing circuit 14, a scaling circuit 16, and an antilog function generator 18.

The electrolytic cell 12 is a stabilized Zirconiumoxide tube which has an atmospheric oxygen reference provided on the interior 20 of the tube 12 and has the detected oxygen flowing along the external surface 22 of the cell 12. Any differential in oxygen concentration across the tube 12 will produce a logarithmic output signal as indicated by curve A of FIG. 2, providing the tube 12 is maintained at a constant predetermined critical temperature. As can be seen from curve A of FIG. 2, the logarithmic output curve changes polarity at approximately 20.9% oxygen which is the reference oxygen used on the inside space 20 of the tube 12. The use of different reference oxygen levels would shift the curve A along this zero point to provide the polarity change at the percent oxygen utilized for the reference gas. In any event, the logarithmic output as indicated by curve A is sensed by electrodes located on opposite sides of the tube 12 in a known manner and is transmitted along line 24 to the biasing circuit 14 of the linearizing circuit 10.

The biasing circuit 14 includes an inverting amplifier 27, whose gain is set at unity by virtue of having identical resistors R1 in the input line 26 which is connected to the negative terminal of the inverting amplifier 27 as well as the feedback loop 28 which is connected across an output line 30 of the amplifier 27 and the input line 26. Thus, the inverting amplifier 27 functions mainly as a biasing inverter with the bias signal originating from an adjustable voltage source 32 which is connected to the positive side of the inverting amplifier 27 along line 34.

Figure 2:
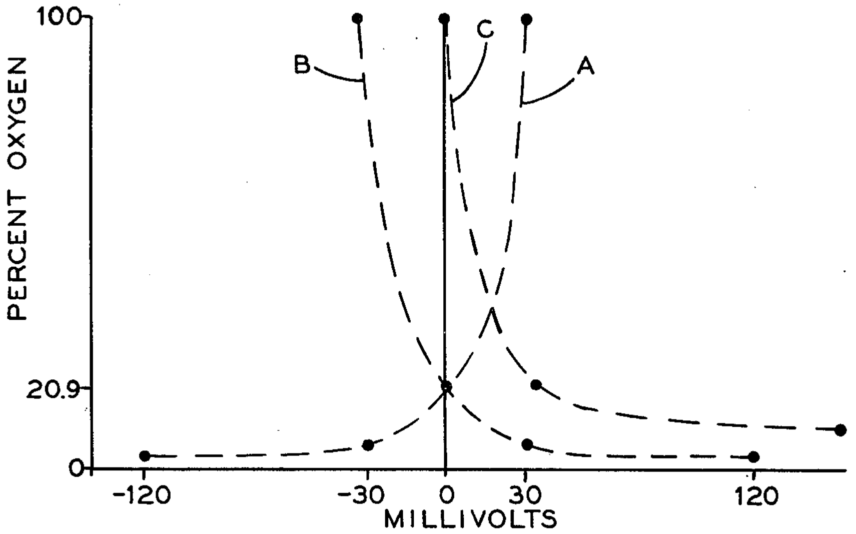
FIG. 2 is a curve of a representative logarithmic output of an oxygen detector and accompanying curves indicating how this signal is modified by the biasing circuit part of the linearizing circuit.

As can be seen from curve B of FIG. 2, the inverting amplifier 27, without any input from the voltage source 32, changes the polarity of the logarithmic output signal of the cell 12 as indicated by curve A to an opposite polarity mirror image of that curve as indicated by curve B on FIG. 2.

The voltage source 32 is used to bias the inverted curve B to shift the curve B entirely to a single polarity. This requires the shifting of an extreme point of the desired range of oxygen detector over to zero. Since the curve B was inverted by the amplifier 27, the maximum desired range possible would be 100% oxygen. Although 100% oxygen was chosen as the particular desired maximum, it will be understood that any range could be taken; such as, 25% or 10% oxygen and then this would be the maximum point and the curve B would be biased appropriately by the voltage source 32 to provide the zero at such chosen point.

This biasing or shift is accomplished by subjecting the cell 12 to 100% oxygen at the detecting point 22 of the cell 12 which places the output of the cell 12 at the extreme point of the logarithmic output curve A as well as its inverted signal at curve B. Since we wish to shift or bias the curve B over to the positive polarity output side, the reference voltage source 32 is varied by adjusting an arm 36 of a variable resistor assembly 38 until the signal from the reference voltage source 32 sent along line 34 to the inverting amplifier 27 is balanced by the input signal from the cell 12 sent along line 26 to the negative terminal of the inverting amplifier 27. At this point, the output from the biasing circuit 14 will be zero with the cell 12 subjected to 100% oxygen and the remaining points of curve C will follow a logarithmic output of a single polarity as may be best seen on the curve C of FIG. 2.

To fully set and calibrate the curve C, we need to set a second point thereon. To accomplish this, the scaling circuit 16 of the linearizing circuit 10 is provided.

The second calibration point used is atmospheric oxygen and that atmospheric oxygen is subjected to the outside surface 22 of the cell 12. Since atmospheric oxygen is also the reference on the inside space 20 of the cell 12, the output signal from the cell 12 is zero as may be seen from curve A of FIG. 2. However, since the biasing signal from the reference voltage source 32 has been already set from the 100% oxygen level calibration, the output from the biasing circuit 14 will be some output along the curve C of FIG. 2 which has to be determined or scaled by the scaling circuit 16.

Since we know that the normal millivolt output of the cell 12 at 100% oxygen is 30 millivolts as seen from curve A, we also know that 30 millivolts had to be provided by the reference voltage source 32 to shift that point to zero in the biasing circuit 14. Thus, we also know that the zero point on curve A had to be similarly shifted 30 millivolts on curve C to provide a true representation of the shifted curve. This allows us to know that with atmospheric oxygen being subjected to the outside surface 22 of the cell 12, the output from the scaling circuit 16 must be some multiple of the 30 millivolt known signal. Since, in this particular case, a voltage instead of a millivoltage output is desired, a scaling factor of 10 is used.

The scaling circuit 16 accomplishes the scaling by the use of an amplifier 40 whose gain is set in a feedback loop 42 by an adjustable resistor 44. Thus, the resistor 44 is manually adjusted for the atmospheric oxygen being detected by the cell 12 until the output from the scaling circuit 16 along line 46 is the desired scale value on curve D.

Figure 3:
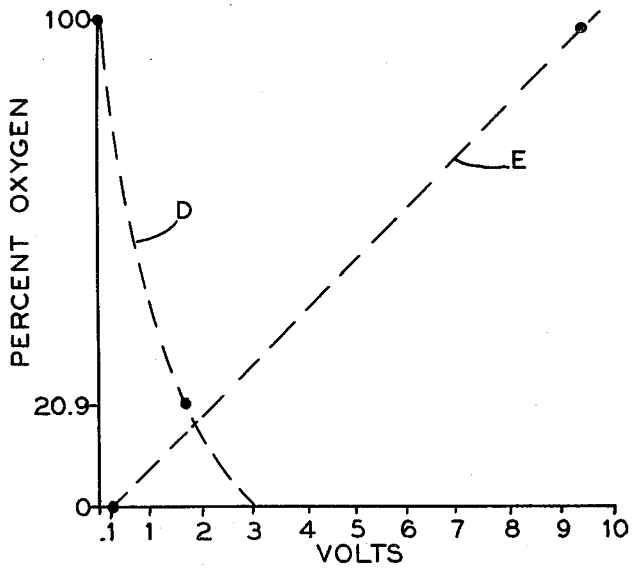
FIG. 3 is a curve indicating how the logarithmic output is modified by the scaling circuit and the antilog generator parts of the linearizing circuit.

The biased and scaled logarithmic output as indicated by curve D of FIG. 3 is then sent to the antilog function generator 18 which converts the logarithmic signal as indicated by curve D to a straight line output signal as indicated by curve E on FIG. 3. As can be seen, the curve E has its zero intercept at 0.1 volts to provide the approximately 10 volt output. The antilog function generator acts as a divider to scale down the signal by 100 as well as to linearize it. Thus, the antilog of 3 instead of being 1,000 becomes 10, the antilog of 2 which is normally 100 becomes 1 and the antilog of 0 which is 10 becomes 0.1 while the antilog of 0 which is 1 becomes 0.001.

Certain modifications and improvements will occur to those skilled in the art upon reading this specification. It will be understood that all such improvements and modifications have been deleted herein for the sake of conciseness and readability but are properly covered within the scope of the following claims.

We claim:

1. A linearizing circuit for an oxygen detector having a logarithmic output range with a polarity change within the output range comprising:

biasing circuit means for zeroing one end point of the logarithmic output range of the oxygen detector to eliminate the polarity change within the output range;

scaling circuit means connected to said biasing circuit means for adjusting a second point on the logarithmic output range of the oxygen detector; and converting means connected to said scaling circuit means for changing the logarithmic output of said scaling circuit means to a linear output.

2. A linearizing circuit as set forth in claim 1 wherein said converting means includes an electronic antilog generator connected to said scaling circuit means to convert the logarithmic output of said scaling circuit means to a linear output from said antilog generator.

3. A linearizing circuit as set forth in claim 1 wherein said biasing circuit means includes an inverting amplifier having the output of the oxygen detector connected to one input thereby; and an adjustable voltage source connected to a second input thereof to allow a zero output from the inverting amplifier whenever said adjustable voltage source is adjusted to compensate for a particular output of the oxygen detector.

4. A linearizing circuit as set forth in claim 3 wherein said scaling circuit means includes an adjustable gain amplifier having an input line connected to the output of said inverting amplifier.

5. A linearizing circuit as set forth in claim 4 wherein said adjustable gain amplifier is an operational amplifier having an adjustable resistor in the feedback loop thereof for scaling a predetermined output of the oxygen detector to a corresponding point on a desired output range.

6. A linearizing circuit as set forth in claim 5 wherein said converting means includes an antilog function generator having an input connected to the output of said operational amplifier to provide a linear output along an output line from said antilog function generator.

7. A method of calibrating a linearizing circuit for a logarithmic output oxygen detector connected to an adjustable biasing circuit for zero adjustment and an adjustable scaling circuit for range adjustment connected to the biasing circuit comprising the steps of:

providing a known maximum desired range output from the oxygen detector;

adjusting the biasing circuit to provide a zero output therefrom for said maximum desired range output;

providing a known intermediate desired range output from the oxygen detector; and adjusting the scaling circuit to provide a known output therefrom corresponding to said known intermediate desired range output.

8. A method as set forth in claim 7 wherein said step of providing a known maximum desired range output from the oxygen detector includes operating the oxygen detector with an atmospheric air reference and a 100% oxygen sensed output.

9. A method as set forth in claim 8 wherein said step of providing a known intermediate desired range output from the oxygen detector includes operating the oxygen detector with an atmospheric air reference and an atmospheric air-sensed output.

10. A circuit for linearizing a logarithmic output range having a polarity change over the output range comprising:

biasing circuit means for zeroing one end point of the output range to eliminate the polarity change thereby;

scaling circuit means connected to said biasing circuit means for adjusting a second point on the output range; and converting means connected to said scaling circuit means for changing the logarithmic output to a linear output.

* * * * *